United States Patent [19]

Driscoll

[11] Patent Number: 4,570,132
[45] Date of Patent: Feb. 11, 1986

[54] LOW NOISE MULTIPLE CRYSTAL-CONTROLLED OSCILLATOR

[75] Inventor: Michael M. Driscoll, Catonsville, Md.

[73] Assignee: The United States of America as represented by the Secretary of the Air Force, Washington, D.C.

[21] Appl. No.: 645,468

[22] Filed: Aug. 29, 1984

[51] Int. Cl.[4] .............................................. H03B 5/36
[52] U.S. Cl. ................................. 331/56; 331/116 R; 331/162
[58] Field of Search ...................... 331/56, 116 R, 162

[56] References Cited
U.S. PATENT DOCUMENTS

| | | | |
|---|---|---|---|
| 3,210,685 | 10/1965 | Zepp | 331/47 |
| 3,366,893 | 1/1968 | Brunins | 331/116 R |
| 3,381,239 | 4/1968 | Lehman | 331/56 |
| 3,401,354 | 9/1968 | Seidel | 331/46 |
| 3,836,873 | 9/1974 | Healey et al. | 331/116 R |
| 4,107,625 | 8/1978 | Courier de Mere | 331/37 |

Primary Examiner—Siegfried H. Grimm
Attorney, Agent, or Firm—Donald J. Singer; Richard J. Donahue

[57] ABSTRACT

An oscillator circuit utilizing multiple (two) quartz crystal resonators as the frequency controlling elements in a novel circuit arrangement. The use of two crystal units increases the oscillator circuit signal transmission group delay by a factor of 2 to 3 and effects an estimated 6 dB reduction in oscillator output signal phase noise sideband level at carrier offset frequencies less than the resonator half-bandwidths. The degree of resonator tracking required is made practical with the use of temperature controlled SC-cut resonators. In addition, the oscillator circuit is configured so that equal, correlated output signal currents can be extracted from each resonator through individual load circuits, thereby increasing available oscillator output signal amplitude by 2:1 and reducing the net effect of uncorrelated load circuit additive noise by 3 dB.

12 Claims, 9 Drawing Figures

TYPICAL OPERATING POINT FOR TEMP. CONTROLLER
ΔF = 3 TO 4 PPM FOR ΔT = 15 TO 20°C

TYPICAL OPERATING POINT
ΔF = 3 TO 4 × $10^{-7}$ FOR ΔT = 15 TO 20°C

LOW NOISE MULTIPLE CRYSTAL-CONTROLLED OSCILLATOR

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to an improved crystal-controlled oscillator circuit and more particularly to a crystal-controlled oscillator circuit in which the lower frequency phase noise in its output signal is significantly reduced.

Recent developments have been made in circuitry which significantly improve the output signal high frequency ($f \geq 10$ KHz) phase noise of synthesized microwave signal generators used in radar STALO (Stable Local Oscillator) applications. One such improved oscillator circuit developed jointly by the present inventor and Daniel J. Healey, III is discussed herein and will be the subject of a related patent application. In light of these advances, it is the moderate frequency ($10$ KHz $\geq f \geq 100$ Hz) phase noise exhibited by the STALO output signals (that is directly attributable to the STALO master oscillator) that currently limits additional dynamic range improvement.

A further shortcoming of known STALO devices is the limited amount of output signal current that can be extracted from the oscillator without adversely effecting its operation.

OBJECTS AND SUMMARY OF THE INVENTION

It is therefore the primary object of the present invention to provide an improved oscillator circuit having a reduced phase noise sideband level.

It is a more specific object of the present invention to provide an oscillator circuit having approximately 6 dB reduction in oscillator output signal phase noise sideband level at carrier offset frequencies less than the resonator half-bandwidths.

It is yet another object of the present invention to provide a low-noise crystal controlled oscillator capable of high signal current output level.

Briefly, the oscillator circuit of the present invention utilizes multiple (two) quartz crystal resonators as the frequency controlling elements in a novel circuit arrangement. The use of two crystal units increases the oscillator circuit signal transmission group delay by a factor of 2 to 3, and effects an estimated 6 dB reduction in oscillator output signal phase noise sideband level at carrier offset frequencies less than the resonator half-bandwidths. The degree of resonator tracking required is made practical with the use of temperature controlled SC-cut resonators. In addition, the oscillator circuit is configured so that equal and correlated output signal currents can be extracted from each resonator through individual load circuits, thereby increasing available oscillator output signal amplitude by 2:1 and reducing the net effect of uncorrelated load circuit additive noise by 3 dB. The aforementioned and other advantages, objects and features of the invention will become apparent after considering the following description thereof in conjunction with the illustrative embodiment of the invention shown in the accompanying drawings.

DETAILED DESCRIPTION OF THE INVENTION

Figure 1:
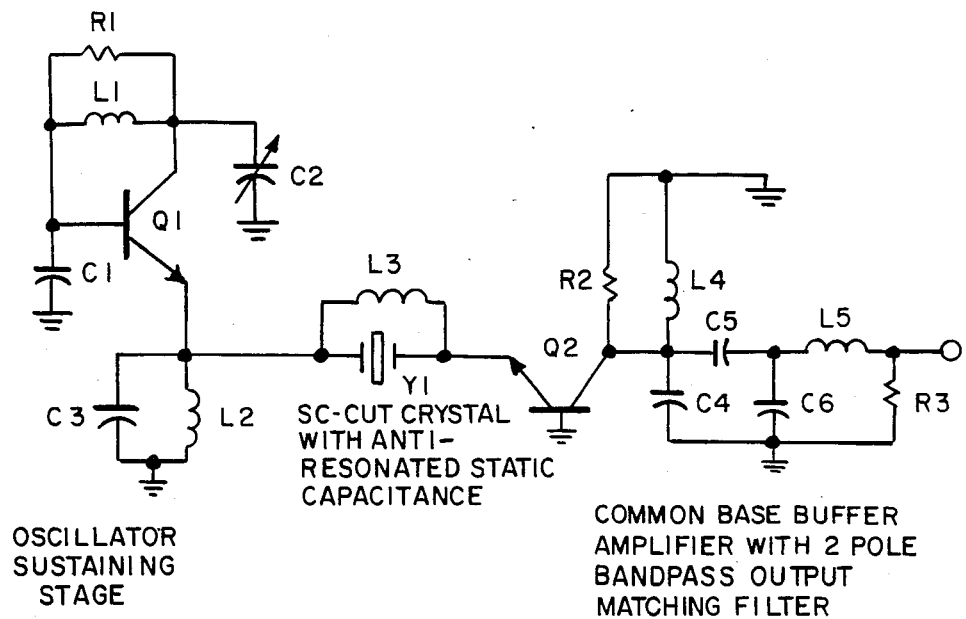
FIG. 1 is a functional schematic diagram of an SC-cut crystal oscillator.

Referring now to the drawings, FIG. 1 shows a functional schematic diagram (equivalent AC circuit) for a related low noise, crystal-controlled oscillator recently developed by the present inventor and Daniel J. Healey, III.

The novel features of the circuit that play an important role in obtaining reduced levels of output signal phase noise are the use of an SC-cut crystal resonator Y1 capable of (linear) operation at high (5 MW) levels of crystal dissipation, and the connection of the oscillator crystal resonator Y1 in series with the load (common base amplifier Q2) circuit so that the frequency selectivity of the resonator is utilized to band-limit the oscillator output signal spectra.

The spectral density of the fractional phase fluctuations of the output signal of the circuit of FIG. 1 (over a carrier offset frequency range 20 MHz $\geq f \geq 10$ Hz) can be expressed in equation [1] below as:

$$S_{\delta\phi}(f) = 2\left(\frac{K1}{f} + K2\right)\left(\frac{1}{d\phi/df}\right)^2\left(\frac{1}{f}\right)^2 + \frac{K3}{f} + K4 \quad [1]$$

where
K1 = oscillator (open loop) flicker noise constant
K2 = oscillator (open loop) white noise constant
fo = carrier frequency
$d\phi/df$ = effective loaded oscillator resonator phase slope = $2Q/fo$ and
Q = effective loaded oscillator resonator Q
K3 = buffer amplifier flicker noise constant
K4 = buffer amplifier white noise constant = FKT.

Figure 2:
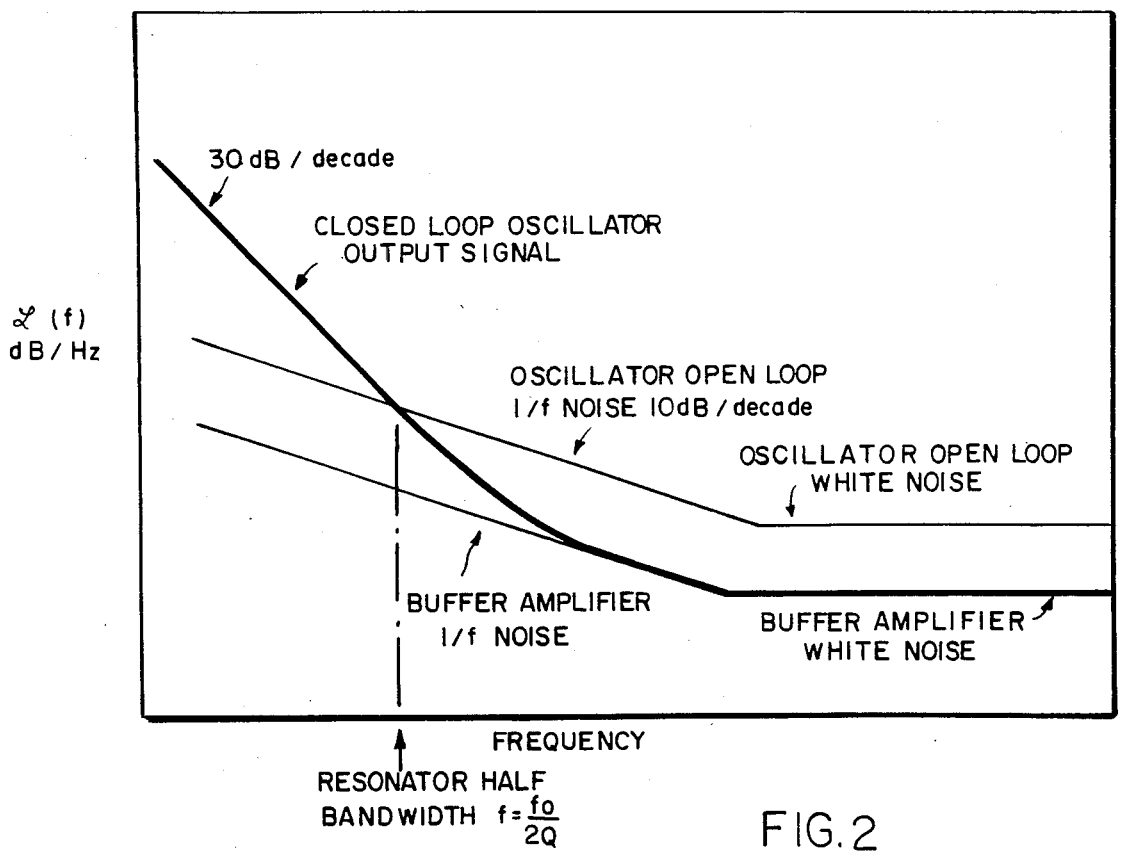
FIG. 2 is a graph depicting typical VHF crystal oscillator short-term frequency stability.

FIG. 2 shows (in general form) the resulting oscillator short-term stability. $L(f) = 10\log(S_{67\phi}(f)/2)$ and is defined as the ratio of the power in one phase noise sideband, on a per Hertz bandwidth spectral density basis, to the total signal power, at Fourier frequency f from the carrier. As shown in FIG. 2, there is a conversion of oscillator (open loop) white phase noise to white frequency noise (20 dB/decade) and flicker phase noise to flicker frequency noise (30 dB/decade) at frequencies less than the oscillator resonator half-bandwidth. This is the result, in the closed loop oscillator, of the conversion of (open loop) oscillator phase uncertainty to (closed loop) frequency uncertainty due to the requirement in the oscillator of maintenance of $2n\pi$ radians closed loop phase shift. The degree of phase to frequency conversion is determined by the oscillator resonator phase slope. At frequencies in excess of the oscillator resonator half-bandwidth, the oscillator signal phase noise spectra is attenuated by virtue of the resonator transmission frequency selectivity characteristic.

Figure 3:
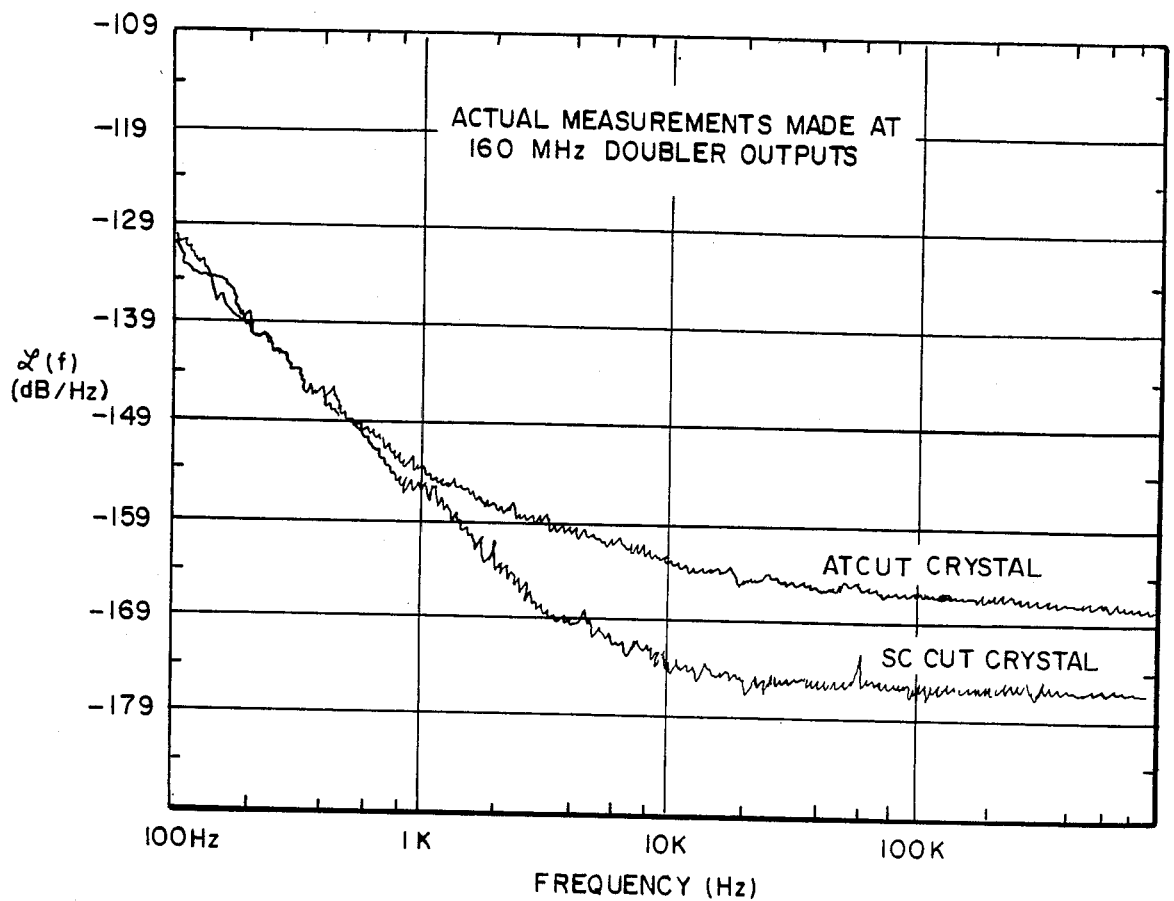
FIG. 3 is a graph depicting measured short-term stability for an AT-cut and an SC-cut crystal oscillator.

FIG. 3 shows a comparison of measured output signal phase noise sideband spectra for the circuit of FIG. 1 and an earlier developed 80 MHz oscillator circuit using an AT-cut crystal resonator. As shown in FIG. 3, the circuit of FIG. 1 provides a means for achieving substantial reduction in output signal phase noise level for carrier offset frequencies in the range $f \geq 1$ KHz. For $f < 1$ KHz however, no improvement is obtained. Referring back to equation [1], the reason for the lack of improvement is that the oscillator circuit flicker noise level (K1 term in equation [1]) is substantially unchanged in the new circuit and the effective Q for the SC-cut resonator is approximately equal to that of the AT-cut resonator used in the earlier-developed circuit. Curve fitting techniques, together with static indirect measurement of oscillator $d\phi/df$ indicate the following approximate values of the equation constants that dominate at $f < 1$ KHz:

$Q = 5 \times 10^4 = \frac{1}{2}$ unloaded crystal Q
$K1 = 1.6 \times\ ^{-13}$
K2 is undetermined (masked by buffer amplifier additive noise).

At offset frequencies in excess of several KHz, the additive phase noise of the oscillator load circuit (buffer amplifier and frequency doubler) becomes dominant and measured data indicates:

$K3 = 4 \times 10^{-14}$
$K4 = 2 \times 10^{-\sim}$.

Figure 4:
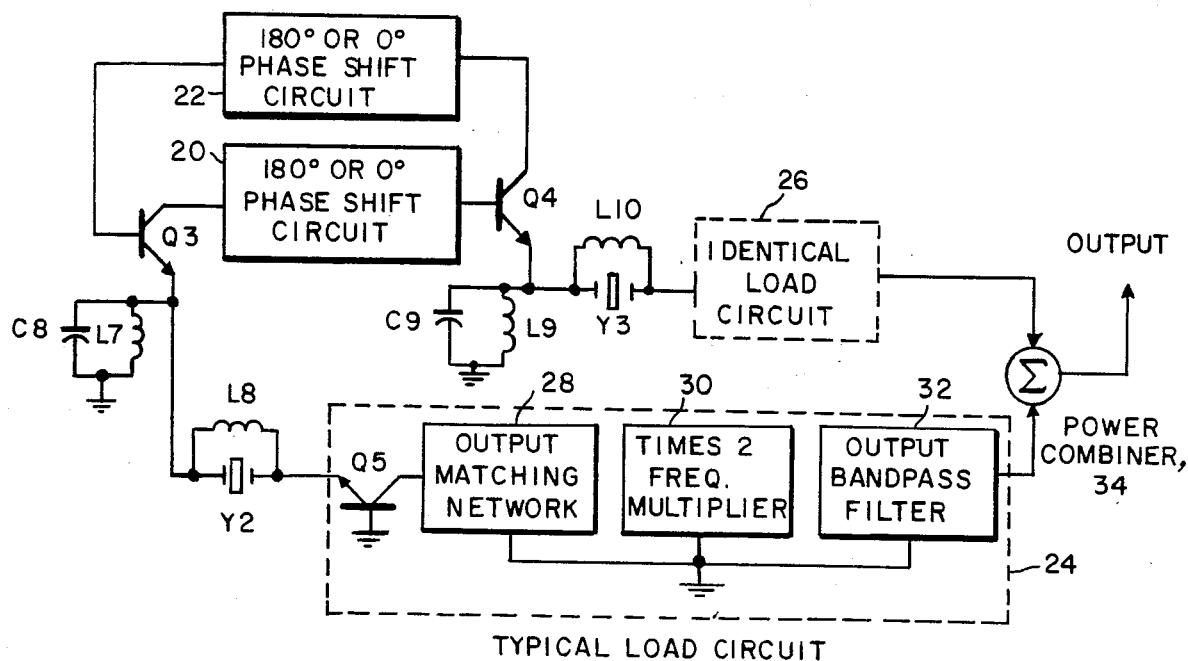
FIG. 4 is a schematic diagram of an oscillator constructed in accordance with the present invention.

The novel oscillator circuit illustrated in FIG. 4 provides a practical means for substantially improving oscillator signal phase noise levels at the load circuit output by increasing effective oscillator resonator $d\phi/df$ by up to three times, and reducing the level of load circuit additive noise by 3 dB. Because the novel circuit can be implemented to utilize two near-identically operated transistor stages, it is possible that the oscillator (open loop) signal flicker noise level can increase by up to 3 dB. In spite of this potential increase, however, substantial improvement in circuit output signal phase noise level can be achieved.

Basically, the novel oscillator circuit comprises transistors Q3 and Q4, phase shift networks 20 and 22 and two crystal resonators Y2 and Y3 whose static capacitances have been anti-resonated using inductors L8 and L10 respectively. The oscillator closed loop signal transmission path gain is at a maximum at the (operating) frequency where the impedance of the crystal resonators Y1 and Y2 are at a minimum. At crystal series resonance the crystal Y1 and Y2 impedances are substantially resistive and the requirement for $2n$ radians oscillator closed loop signal phase shift is satisfied utilizing phase shift networks 20 and 22 exhibiting either 0 or 180 degrees signal phase shift at the operating frequency.

The phase shift networks 20 and 22 are designed to additionally provide slightly more than unity oscillator closed loop small signal gain necessary for oscillator turn-on, and also must exhibit adequate frequency selectively to prevent circuit oscillation at undesired crystal resonances. A loaded Q of 4 to 6 in the phase shift networks 20 and 22 is sufficient. The tuned circuits formed by capacitor C8 and inductor L7, and also by capacitor C9 and inductor L9 are each resonant at the operating frequency of the oscillator and aid in preventing parasitic oscillations at higher frequencies.

Using identical broadband load circuits 24 and 26, which may typically include a common base amplifier Q5, an output matching network 28, frequency doubler 30 and a doubler output filter 32, the load circuit output signals are correlated and are combined in a 180 or 0 degree signal power combiner 34, depending on whether 0 or 180 degree phase shift networks are used in the oscillator, respectively. An alternative to the use of a signal power combiner is the use of a frequency summing network or mixer, especially in instances where additional frequency multiplication is desired.

This oscillator circuit will be seen to differ from the FIG. 1 circuit, in that two cascaded transistor stages Q3 and Q4 are utilized in the oscillator sustaining circuit, each connected to separate crystal resonators Y1 and Y2 feeding separate load circuits 24 and 26. The result is that the effective oscillator closed loop signal transmission phase slope, $d\phi/df$ (or group delay $(d\phi/dw)$), is two to three times larger than for the FIG. 1 circuit. The reason the group delay is more than simply twice that for the FIG. 1 circuit can be explained as follows:

Static measurement of FIG. 1 circuit $d\phi/df = 2Q/fo$ indicates the effective resonator Q is only 50 to 60 percent of the unloaded resonator Q. The degradation in effective Q is largely a result of additional resonator loading from the resistive portion of the sustaining stage and buffer amplifier impedances facing the crystal resonator. Because the oscillator circuit of FIG. 1 is self-limiting, steady state operation requires a reduction in small signal (closed loop) excess gain. This reduction is accomplished (with increasing signal level) when Q1 in FIG. 1 current limits or "turns off" during a portion of the instantaneous RF signal waveform. As a result of partial conduction in Q1, the resistive portion of the Q1 emitter-to-ground impedance 'seen' by the crystal unit increases. It is the fundamental Fourier component of this impedance, together with the input impedance of the common base buffer amplifier, that effect the resonator Q degradation. For the FIG. 1 circuit, small signal excess gain is set typically at 3–5 dB. In other words, Q1 must cut-off for a sufficient portion of the RF waveform cycle to reduce Q1 signal gain by 4 dB.

In the circuit of FIG. 4, either of two methods might be employed for self limiting: current limiting in only one of the two oscillator transistor stages Q3 and Q4 to provide 4 dB typical gain reduction, with the other stage operated class A, or current limiting in both stages, but reduced limiting (2 dB gain reduction) required in each stage. In either case, the net oscillator closed loop group delay or phase slope should be greater than twice that of the FIG. 1 circuit.

Figure 5A:
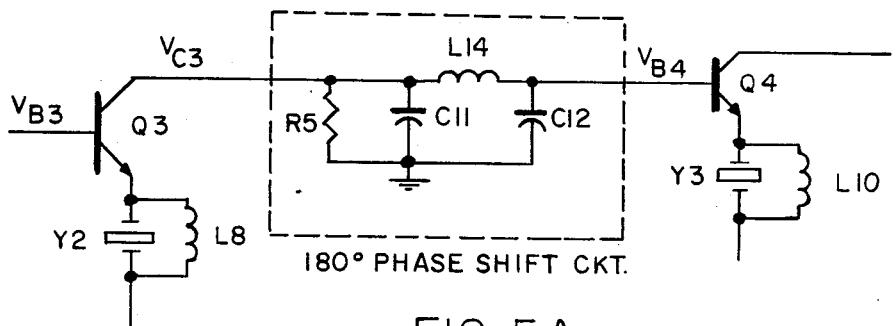
FIGS. 5A and 5B depict 180° and 0° phase shift circuits respectively that may be utilized in the present invention.

The 180° phase shift networks 20 and 22 in FIG. 4 can be implemented in any number of ways. Both can be configured as identical pi networks, as shown in FIG. 5A. Selection of network reactive and resistive component values allows the desired network voltage gain and selectivity (bandwidth) to be obtained. The selection of the individual values of C11 and C12 determine the circuit bandwidth while the ratio of the values of C11 to C12 set the $V_{B4}$ to $V_{C3}$ gain. The value of inductor L14 is chosen such that it will resonate with the series connected equivalent value of C11 and C12 at the desired operating frequency. The value of R5 sets the gain of transistor Q3. The input impedance of transistor Q4 is large compared to the reactance of capacitor C12.

Figure 5B:
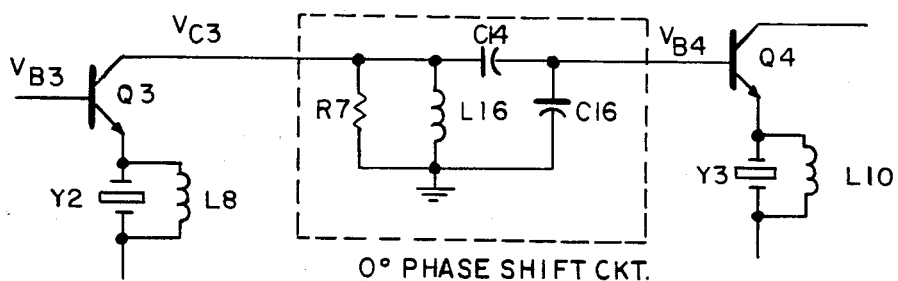

The cascaded selectivity of the two 180° phase shift networks must be sufficient to prevent circuit oscillation not only at unwanted resonator overtone modes of vibration, but for the case of the SC-cut resonator, must also prevent oscillation at the so-called B mode (which occurs at a frequency approximately 10% higher than for the desired C mode). Selection of 20 to 25% bandwidth in each network suffices. It should be noted that 0° degree phase shift networks could be employed (FIG. 5B) in place of the 180° networks. If this is done, oscillator outputs are nominally 180° out of phase and can be added at the load circuit outputs using a 180° power combiner.

Figure 8:
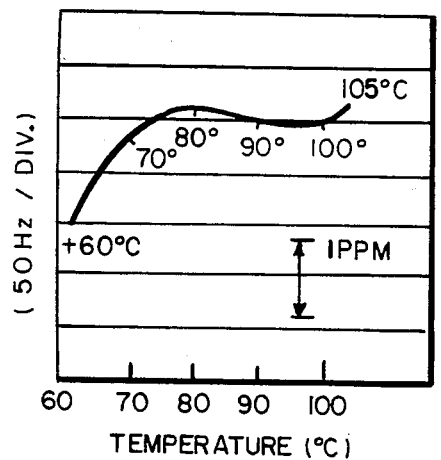
FIG. 8 is a graph illustrating the measured frequency vs temperature characteristic for an SC-cut crystal.
Figure 6:
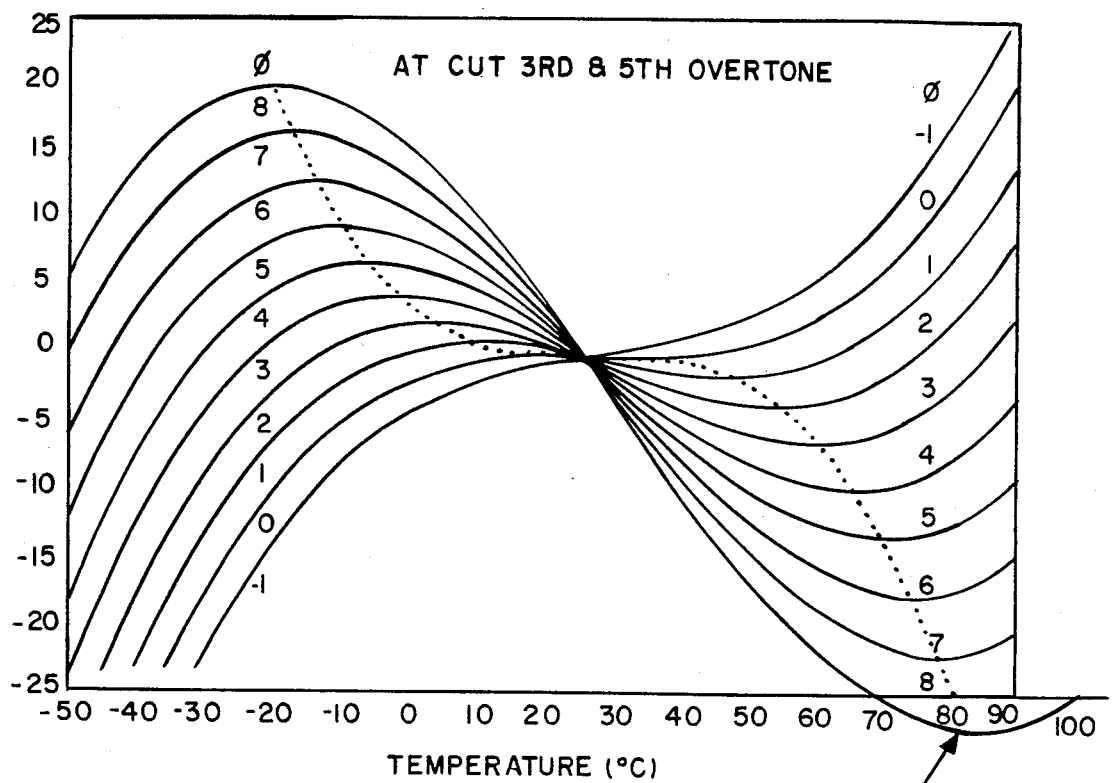
FIG. 6 is a graph illustrating the temperature-frequency variation characteristics of an AT-cut crystal.
Figure 7:
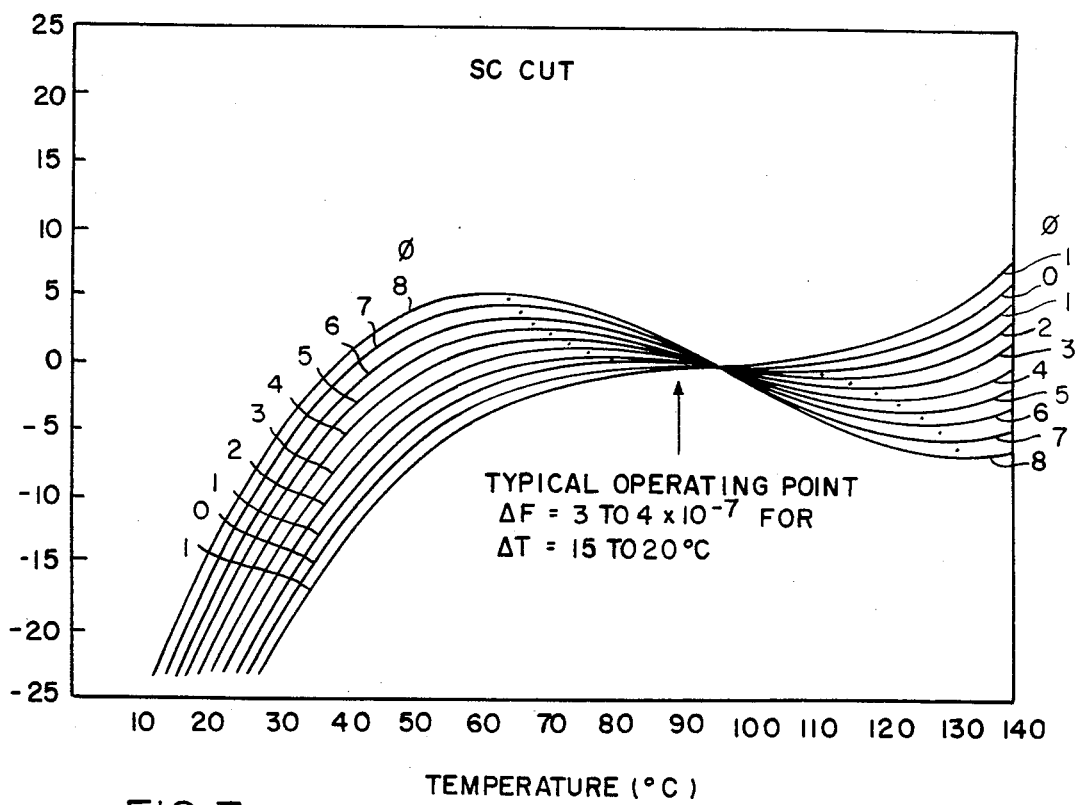
FIG. 7 is a graph illustrating the temperature-frequency variation characteristics of an SC-cut crystal.

It is necessary, in the circuit of FIG. 4, for the series resonant frequency of each of the two resonators Y1 and Y2 to either remain constant or to drift identically over time and temperature. FIGS. 6 and 7 show a comparison of the frequency variation-temperature curves for AT and SC-cut resonators. FIG. 8 shows the actual measured frequency variation-temperature characteristic for an 80 MHz, 3rd overtone, SC-cut resonator. As shown in the figures, the frequency change exhibited by a temperature controlled SC-cut resonator (housed in a simple, readily available, temperature controller) can be held to less than $\pm 2 \times 10^{-7}$. In addition, ageing rates for these resonators are at less than $5 \times 10^{-10}$/day. When one compares the estimated, long-term, 1 PPM non-tracking frequency change between resonators (due to temperature change and ageing) to the 14 PPM estimated loaded resonator bandwidth, the result is a shift in the oscillator operating frequency from a condition where each resonator impedance is pure resistive (series resonance) to a condition where each resonator impedance has a small imaginary component (8 degree impedance phase angle).

For frequency uncertainties on the order of 10% of the resonator bandwidth, the resultant operating frequency remains substantially centered in the resonator series transmission response, as shown in FIG. 8, and oscillator performance remains unaffected.

An additional advantage of the use of the novel oscillator circuit shown in FIG. 4 involves the extraction of oscillator signal current through separate load circuits 24 and 26. When the oscillator circuit is utilized for generation of low noise UHF reference signals via cascaded stages of broadband, low noise, low order frequency multiplication, it is advantageous to include the first of the cascaded multiplier stages in the individual oscillator load circuits. In this manner, the effects of the additive phase noise of the first multiplier stage(s) can be reduced by 3 dB. This is accomplished because as already mentioned, the oscillator signals are correlated when added, and the additive noise of the load circuits is not correlated.

Included below is a calculation of output signal phase noise sideband spectra for the novel circuit, assuming use of buffer amplifiers and multipliers having identical additive phase noise to those used in the FIG. 3 circuit.

$$L(f) = $$

$$10 \log \left[ \left( \frac{K1}{f} + K2 \right) \left( \frac{1}{d\phi/df} \right)^2 \left( \frac{1}{f} \right)^2 + \frac{K3}{f} + K4 \right]$$

where:
K1 (worst case)=twice that of FIG. 1 circuit=$3.2 \times 10^{-13}$;
K2 is undetermined (masked by buffer amplifier noise); $d\phi/df = 3.5 \times 10^{-13}$ (loaded Q=70,000 in each resonator);
K3=one half that of FIG. 1 circuit (de-correlation in combiner)=$2 \times 10^{-14}$;
K4=one half that of FIG. 1 circuit (de-correlation in combiner)=$1 \times 10^{-18}$.

Oscillator open loop phase noise levels are assumed to be 3 dB higher (worst case) than that of the FIG. 1 circuit, with an oscillator $d\phi/df$ of $3.5 \times 10^{-3}$ radians/Hz (corresponding to a loaded Q of 70,000 in each resonator).

As shown in the table below, the result represents a substantial improvement over the 100 Hz to 1 KHz offset frequency range of interest.

| frequency (Hz) | L (f) (dB/Hz) | Improvement, compared to Figure 1 circuit (dB) |
|---|---|---|
| 100 | −136 | 6 |
| 200 | −145 | 6 |
| 400 | −153 | 5 |
| 800 | −161 | 5 |
| 10K | −175 | 3 |
| 100K | −180 | 3 |

Although the invention has been described with reference to a particular embodiment, it will be understood to those skilled in the art that the invention is capable of a variety of alternative embodiments within the spirit and scope of the appended claims.

What is claimed is:
1. A low noise crystal controlled oscillator comprising:
   first and second transistors each having a base, an emitter and a collector;
   a first phase shift circuit coupled between the collector of said first transistor and the base of said second transistor;
   a second phase shift circuit coupled between the collector of said second transistor and the base of said first transistor;
   a reference terminal;
   third and fourth transistors each having a base coupled to said reference terminal, an emitter and a collector;
   a first crystal resonator unit coupled between the emitter of said first transistor and the emitter of said third transistor;
   a second crystal resonator unit coupled between the emitter of said second transistor and the emitter of said fourth transistor;
   a signal combiner having a pair of input terminals and an output terminal;
   first means for coupling the collector of said third transistor to one of said pair of input terminals of said signal combiner; and
   second means for coupling the collector of said fourth transistor to the other one of said pair of inputs of said signal combiner.

2. Apparatus as defined in claim 1 wherein said first crystal resonator unit and said second crystal resonator unit have substantially the same series resonance frequency.

3. Apparatus as defined in claim 2 wherein said first crystal resonator unit and said second crystal resonator unit are each SC-cut quartz crystals.

4. Apparatus as defined in claim 3 wherein said signal combiner is a signal power combiner.

5. Apparatus as defined in claim 3 wherein said signal combiner is a signal frequency combiner.

6. Apparatus as defined in claim 3 and further including first and second inductors shunting said first and said second crystal resonator units respectively.

7. Apparatus as defined in claim 3 wherein said first phase shift circuit and said second phase shift circuit each exhibit 0 degrees phase shift at the operating frequency of said oscillator.

8. Apparatus as defined in claim 3 wherein said first phase shift circuit and said second phase shift circuit each exhibit 180 degrees phase shift at the operating frequency of said oscillator.

9. Apparatus as defined in claim 3 and further comprising:
a first parallel tank circuit resonant at the operating frequency of said oscillator coupled between the emitter of said first transistor and said reference terminal; and
a second parallel resonant tank circuit resonant at the operating frequency of said oscillator coupled between the emitter of said second transistor and said reference terminal.

10. Apparatus as defined in claim 3 wherein said first means comprises:
an output matching network, a frequency doubler circuit and a frequency doubler output filter serially coupled between the collector of said third transistor and said one of said pair of input terminals of said signal combiner; and
wherein said second means comprises:
an output matching network, a frequency doubler circuit and a frequency doubler output filter serially coupled between the collector of said fourth transistor and said other one of said pair of input terminals of said signal combiner.

11. Apparatus as defined in claim 7 wherein said signal combiner is a 180 degree signal combiner.

12. Apparatus as defined in claim 8 wherein said signal combiner is a 0 degree signal combiner.

* * * * *

UNITED STATES PATENT AND TRADEMARK OFFICE
CERTIFICATE OF CORRECTION

PATENT NO. : 4,570,132
DATED : 11 February 1986
INVENTOR(S) : Michael M. Driscoll It is certified that error appears in the above-identified patent and that said Letters Patent is hereby corrected as shown below:

In column 2, at line 58, the term "$S_{67}$" in the equation should read --$S_{\delta\phi}$--.

In column 3, at line 28, the equation "$K1=1.6X^{-13}$" should read --$K1=1.6X10^{-13}$--.

In column 3, at line 36, the equation "$K4=2X10-$" should read --$K4=2X10^{-18}$--.

Signed and Sealed this

Eighth Day of July 1986

[SEAL]

Attest:

DONALD J. QUIGG

Attesting Officer  Commissioner of Patents and Trademarks